(12) United States Patent
Ahtee et al.

(10) Patent No.: US 10,429,186 B2
(45) Date of Patent: Oct. 1, 2019

(54) MICROELECTROMECHANICAL DEVICE WITH MOTION LIMITERS

(71) Applicant: MURATA MANUFACTURING CO., LTD., Nagaokakyo-shi, Kyoto (JP)

(72) Inventors: Ville Ahtee, Espoo (FI); Ville Pekka Rytkönen, Klaukkala (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 567 days.

(21) Appl. No.: 14/630,763

(22) Filed: Feb. 25, 2015

(65) Prior Publication Data
US 2015/0241216 A1  Aug. 27, 2015

(30) Foreign Application Priority Data
Feb. 26, 2014 (FI) .................................. 20145184

(51) Int. Cl.
*G01C 19/5712* (2012.01)
*B81B 3/00* (2006.01)
*G01P 15/125* (2006.01)
*G01P 15/08* (2006.01)

(52) U.S. Cl.
CPC ........ *G01C 19/5712* (2013.01); *B81B 3/0051* (2013.01); *G01P 15/125* (2013.01); *B81B 2201/0235* (2013.01); *B81B 2203/0181* (2013.01); *B81B 2203/058* (2013.01); *G01P 2015/0831* (2013.01); *G01P 2015/0871* (2013.01)

(58) Field of Classification Search
CPC ............... G01P 15/125; G01P 19/5712; G01P 2015/0831; G01P 2015/0871; G01P 2015/0874; B81B 2203/0118; G01C 19/5712

USPC ........................................ 73/504.12; 257/415
See application file for complete search history.

(56) References Cited

U.S. PATENT DOCUMENTS

| | | | |
|---|---|---|---|
| 2002/0189355 A1 | 12/2002 | Leonardson | |
| 2010/0242600 A1 | 9/2010 | Lin et al. | |
| 2011/0219875 A1 | 9/2011 | Walther et al. | |
| 2012/0055249 A1 | 3/2012 | Miyatake et al. | |
| 2012/0216616 A1* | 8/2012 | Schultz | G01P 15/125 73/514.38 |
| 2012/0223726 A1 | 9/2012 | Zhang et al. | |
| 2012/0280591 A1 | 11/2012 | Schultz | |

(Continued)

FOREIGN PATENT DOCUMENTS

JP    2013-217844 A    10/2013

OTHER PUBLICATIONS

U.S. Office Action U.S. Appl. No. 14/630,801 dated Dec. 3, 2015.
(Continued)

*Primary Examiner* — Peter J Macchiarolo
*Assistant Examiner* — Irving A Campbell
(74) *Attorney, Agent, or Firm* — Squire Patton Boggs (US) LLP

(57) ABSTRACT

A microelectromechanical device that comprises a first structural layer, and a movable mass suspended to a primary out-of plane motion relative the first structural layer. A cantilever motion limiter structure is etched into the movable mass, and a first stopper element is arranged on the first structural layer, opposite to the cantilever motion limiter structure. Improved mechanical robustness is achieved with optimal use of element space.

23 Claims, 6 Drawing Sheets

(56) References Cited

U.S. PATENT DOCUMENTS

| | | |
|---|---|---|
| 2013/0019678 A1 | 1/2013 | Lazaroff et al. |
| 2013/0068022 A1 | 3/2013 | Jeung et al. |
| 2013/0111992 A1 | 5/2013 | O'Brien |
| 2013/0186200 A1 | 7/2013 | Classen |
| 2013/0192370 A1 | 8/2013 | Yoda |
| 2013/0299923 A1 | 11/2013 | Classen et al. |
| 2013/0333471 A1* | 12/2013 | Chien ................. G01P 15/0802 73/514.32 |
| 2015/0233965 A1* | 8/2015 | Guo ..................... G01P 15/125 73/514.32 |

OTHER PUBLICATIONS

International Search Report application No. PCT/IB2015/051415 dated May 15, 2015.
Finnish Search Report dated Oct. 14, 2014 corresponding to Finnish Patent Application No. 20145184.
Finnish Search Report dated Oct. 17, 2014 corresponding to Finnish Patent Application No. 20145186.
Finnish Search Report dated Oct. 15, 2014 corresponding to Finnish Patent Application No. 20145185.
Taiwanese Search Report issued in corresponding Taiwanese Patent Application No. 104105760 dated May 18, 2018.

\* cited by examiner

MICROELECTROMECHANICAL DEVICE WITH MOTION LIMITERS

BACKGROUND

Field

The present invention relates to microelectromechanical devices and especially to a microelectromechanical device, as defined in the preamble of the independent claim.

Description of the Related Art

Micro-Electro-Mechanical Systems, or MEMS can be defined as miniaturized mechanical and electro-mechanical systems where at least some elements have a mechanical functionality. MEMS devices can be applied to quickly and accurately detect very small changes in physical properties.

Motion limiters are commonly used in MEMS devices to control the maximum distance that a movable structure inside a device can displace. Another purpose for motion limiters is to dissipate energy in a controlled way in case a movable structure collides with an anchored structure inside a device due to a sudden high acceleration event. Such an event may occur, for example, when a device is accidentally dropped to the floor on a manufacturing line. Design limits are also at risk during element testing.

In collision, the primary purpose of a motion limiter is to protect the device from breakage by preventing fragile points of structures, e.g., sharp corners or narrow beams touching other surfaces. However, the motion limiter itself may also break if it is not robust enough. The robustness of a motion limiter can be enhanced, for example, by increasing the contact area between the contacting surfaces. However, this increases the risk of stiction between the contacting surfaces. Another conventional approach is to add flexibility to the impact such that the kinetic energy of the moving mass is transformed into potential energy within the motion limiter structure.

Efficient motion limiting is especially complicated in structures where a movable mass is designed to undergo out-of-plane linear or rotary motion above or between further structural layers. It is difficult to create truly robust structure without significantly increasing the size or complexity of the configuration.

SUMMARY

An object of embodiments of the present invention is to provide a compact robust motion limiter configuration for microelectromechanical devices that include a movable mass designed to move out-of-plane of its structural layer. These and other objects of the invention are achieved with a microelectromechanical device as described and claimed herein.

Embodiments of the invention include a microelectromechanical device that can have a first structural layer, and a movable mass suspended to a primary out-of plane motion relative the first structural layer. A cantilever motion limiter structure is etched into the movable mass, and a first stopper element is arranged on the first structural layer, opposite to the cantilever motion limiter structure.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with examples of a device architecture in which various embodiments of the invention may be implemented. Only elements relevant for illustrating the embodiments are described in detail. Various implementations of microelectromechanical devices that are generally known to a person skilled in the art may not be specifically described herein.

Figure 1A:
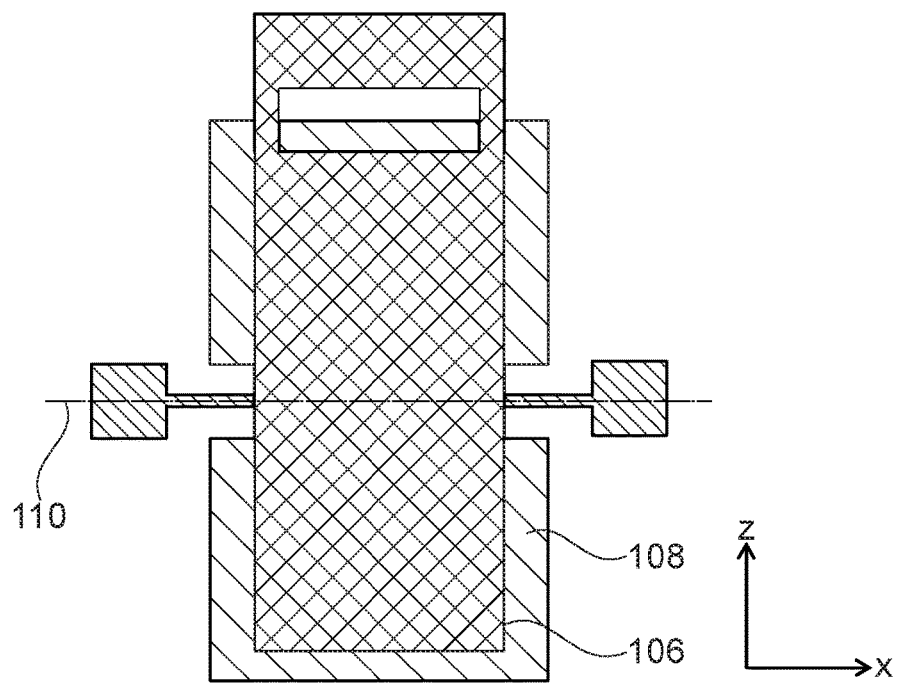
FIGS. 1A and 1B illustrate an exemplary structure of a microelectromechanical device applying out-of-plane motion.
Figure 1B:
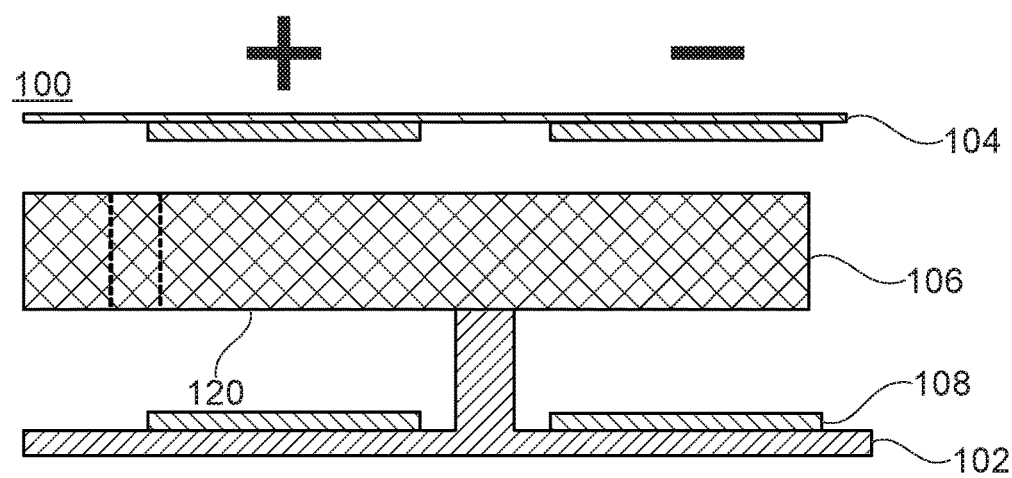

FIGS. 1A and 1B illustrate an exemplary structure of a microelectromechanical device according to embodiments of the present invention. The microelectromechanical device refers here to a layered structure formed of planar, solid or patterned layers. Terms in-plane and out-of plane thus refer here to directions that are aligned with a plane of a structural layer or non-aligned with a plane of a structural layer, respectively.

A microelectromechanical device 100 includes at least one structural layer and a movable mass suspended from it. FIG. 1B shows a configuration that includes a first structural layer 102, a second structural layer 104, and a third structural layer 106. The first structural layer 102 may be, for example, a substrate or a handle wafer. The second structural layer 104 may be, for example, a covering cap wafer of a microelectromechanical device die. It is noted that structural divisions (e.g. a handle wafer, a cap wafer etc.) used here are conceptual only. For a person skilled in the art it is clear that the structural layers may be patterned separately or in combination from, for example, a layered silicon-on-insulator substrate.

The third structural layer 106 may be applied as a movable mass 120. The movable mass 120 may be suspended on the first structural layer 102 such that the movable mass 120 can undergo out-of-plane motion in relation of at least the first structural layer 102. In the configuration of FIGS. 1A and 1B the out-of-plane motion is rotary motion about an in-plane rotation axis 110 between the first structural layer 102 and the second structural layer 104. The invention is not, however, limited to rotary motion only. Features of the invention may be applied also to out-of-plane linear motion in respect of an underlying or covering layer.

FIGS. 1A and 1B illustrate the element in neutral position when no biasing charges or external accelerating forces are applied to it. At operation the movable mass 120 may, for example in response to external z-direction acceleration, move in a see-saw or teeter-totter type of rotary motion about the in-plane rotary axis 110. The movable mass 120 may extend planarly to opposite directions from the rotary axis. During said rotary motion, the movable mass 120 may turn about the rotary axis such that one end of the movable mass moves away from the suspending structural layer and the other end of the movable mass moves towards the suspending structural layer. Movement of the movable mass may be induced and/or detected with electrodes 108 arranged to the underlying or covering layers. FIGS. 1A and 1B illustrate the embodiment with an exemplary configuration of one movable mass. The invention is, however, correspondingly applicable to configurations with one or more movable masses and to configurations where the movement includes oscillatory rotary motion, or linear out-of-plane motion.

Figure 2:
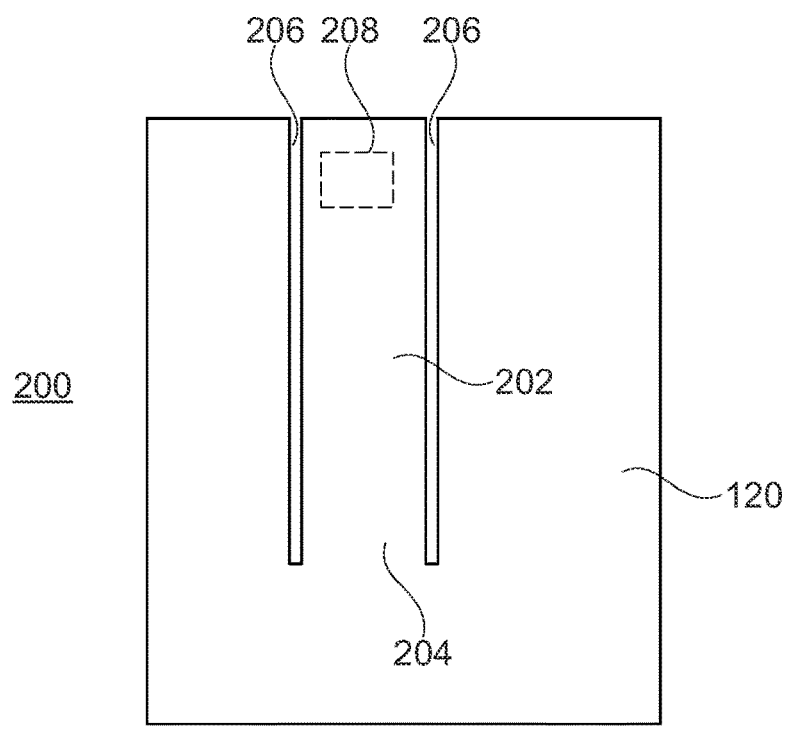
FIG. 2 illustrates an exemplary motion limiter structure applicable in a microelectromechanical device.

Advantageously at least one of the motion limiters of a microelectromechanical device is a flexible motion limiter that facilitates some form of an elastic displacement in response to mechanical force exerted to it at contact. FIG. 2 illustrates an exemplary motion limiter structure 200 applicable in a microelectromechanical device of FIGS. 1A and 1B. The microelectromechanical device of FIG. 2 includes at least one motion limiter structure etched into the movable mass 120 by locally removing volume material of the movable mass. Element parts of the motion limiter structure are thus at least partly separated from the movable mass but in neutral position share the same spatial volume with it. By appropriate choice of the etched lines, it is possible to provide within the movable mass a cantilever motion limiter structure that maintains a mechanical connection to the movable mass, as shown in FIG. 2.

The cantilever motion limiter structure of FIG. 2 includes a simple elongate element 202. Elongate in this context means that the on-plane length of an element is at least twice the maximum on-plane width of the element. One end of the elongate element is fixed to the movable mass 120 and the other end is free. The fixed end may be anchored to a support or coupled to the support via an intermediate structure, as will be discussed later on, Openings 206 that are etched into the movable mass extend in the plane of the movable mass, but do not planarly cross through the plane of the movable mass, and form inner side walls to the movable mass. The elongate element 202 of FIG. 2 extends between two inner side walls of the movable mass, and one end 204 of the elongate element 202 is mechanically coupled to the movable mass 120. In the microelectromechanical device, the elongate element moves with the movable mass, and the lateral end of the elongate element is positioned to become into contact with another element when the motion of the movable mass needs to be controlled. The lateral end of the elongate beam may thus be considered to form an impact element 208. When contact to the impact element takes place, the elongate element carries the force to the support in the movable mass, where it is forced against by a moment and shear stress. At impact, the impact element is adapted to undergo a resilient rotary motion about an in-plane rotary axis that coincides with the point where the elongate element couples to the movable mass.

Figure 3:
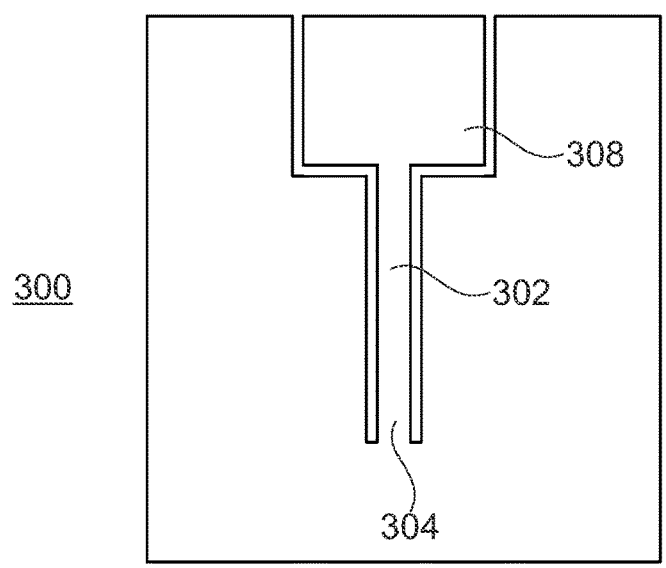
FIG. 3 illustrates another exemplary motion limiter structure.

FIG. 3 illustrates an alternative motion limiter structure 300. The motion limiter structure of FIG. 3 includes again an elongate element 302 that extends between two inner side walls of the movable mass. One end 304 of the elongate element 302 is mechanically coupled to the movable mass. The lateral end of the elongate element 302 includes an impact element 308. In the configuration of FIG. 3, the impact element 308 is a formed section with different in-plane width than the elongate element 302. It is understood that while the thickness of the movable mass layer is constant, the spring constant or stiffness of the elongate element is by far dependent on the on-plane length width of the elongate element. FIG. 3 illustrates that the spring rate and thus the flexibility of the elongate element may be adjusted by adjusting the on-plane dimensions of the elongate element. In addition, during lifetime of a microelectromechanical device, dimensions or mutual positioning between structural layers may change because of, for example, temperature variations. As shown in FIG. 3, in order to allow tolerance to the positioning, the largest in-plane width of the impact element may be adjusted to be larger (for example, three or more times) the width of the remaining part of the elongate element.

Figure 4:
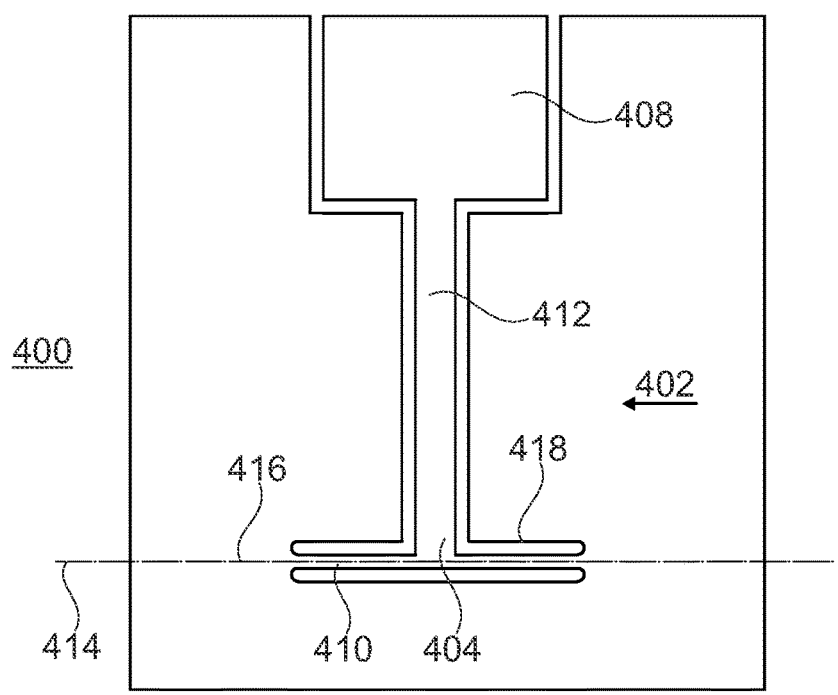
FIG. 4 illustrates a further exemplary motion limiter structure.

FIG. 4 illustrates a further alternative motion limiter structure 400. The motion limiter structure of FIG. 4 includes again an elongate element 402 that extends between two inner side walls of the movable mass. One end of the elongate element 402 is mechanically coupled to the movable mass. The elongate element 402 includes an impact element 408, a torsion element 410 and a coupling beam 412. The impact element 408 represents here again a section of the motion limiter structure that is adapted to provide a point of contact at a time the motion of the movable mass needs to be limited. In the configuration of FIG. 4, the impact element 408 is a formed section with different in-plane width than the coupling beam 412. The impact element is a section of the motion limiter structure 400 that is to be positioned opposite to a designed point of contact in the first structural layer. FIG. 4 illustrates a rectangular impact element, but the impact element may have any shape. The impact element 408 may locate in any point of the movable mass, but advantageously one of the side surfaces of the motion limiter structure coincides with the side surface of the movable mass.

At impact, the impact element 408 is adapted to undergo a resilient rotary motion about an in-plane rotary axis. The motion is delivered by the coupling beam 412 to an in-plane torsion element 410 that twists according to it. When twisted, the torsion element 410 stores the mechanical energy of the motion and exerts an increasing force in the opposite direction; proportional to the amount it is twisted. The torsion element 410 couples to the movable mass, and thus provides an in-plane torsional spring for the rotary motion of the impact element.

An axis 414 passing through two coupling points 416, 418 in the movable mass defines a first direction, a direction of the in-plane rotary axis of the impact element. In a simple and therefore advantageous embodiment, the torsion element may be implemented as a torsion bar, a linear elongate element that extends in the first direction between the two coupling points 416, 418 in the movable mass, as shown in FIG. 4. Other corresponding spring forms, like a meander type spring, may be applied in the torsion element. The torsion element is subject to twisting about the in-plane rotary axis by torque applied at its ends and the point of connection to the coupling beam between its ends. Advantageously the first direction is aligned to a side or end surface of the movable mass. In case of the movable mass is adapted for rotary motion, the first direction is advantageously aligned to be parallel or perpendicular to the axis of rotation of the movable mass.

The coupling beam 412 refers here to an element that acts as a lever arm for a mechanical force that results from out-of-plane impact of the impact element. The coupling beam may 412 be a linear bar, but other structural forms axially coupling the impact element 408 and the torsion element 410 may be applied within the scope. The point of contact 404 to the torsion element 410 is advantageously between the coupling points 416, 418, more specifically in the middle of the torsion element 410.

The disclosed configuration provides a balanced and efficient torsional force to limit the out-of-plane motion. With the torsion spring, flexibility in the out-of-plane direction can be optimized by spring stiffness of the torsion element 410 and lever arm length of the coupling beam 412. On the other hand, in the other directions, the structure is very rigid and therefore stable. Furthermore, it has been detected that in MEMS device dimensions, a torsion spring allows a compact spring design even with very reasonable springs widths.

Figure 5A:
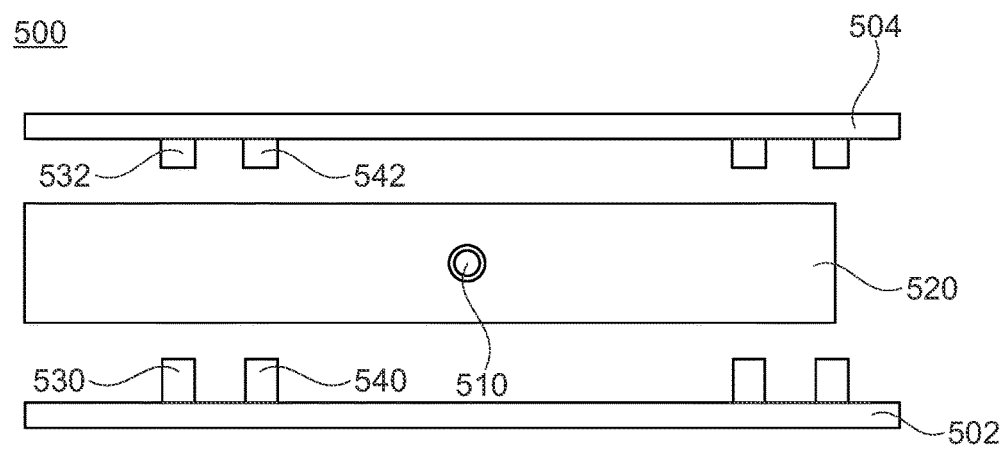
FIG. 5A illustrates a side view of an exemplary microelectromechanical device that includes motion limiters.

The microelectromechanical device also includes at least one first stopper element on the first structural layer, opposite to the impact element of the motion limiter structure. FIG. 5A shows a side view and FIG. 5B a top view of an exemplary microelectromechanical device that includes any of the motion limiter structures of FIGS. 2 to 4. As in FIG. 1B, FIG. 5A shows a microelectromechanical device that includes a first structural layer 502, a second structural layer 504 and a movable mass 520 adapted for primary rotation about an in-plane rotary axis 510. In the example, the first structural layer 502 is a substrate, the second structural layer 504 is a cap wafer, and the movable mass 520 is an element in a structure wafer between them.

Figure 5B:
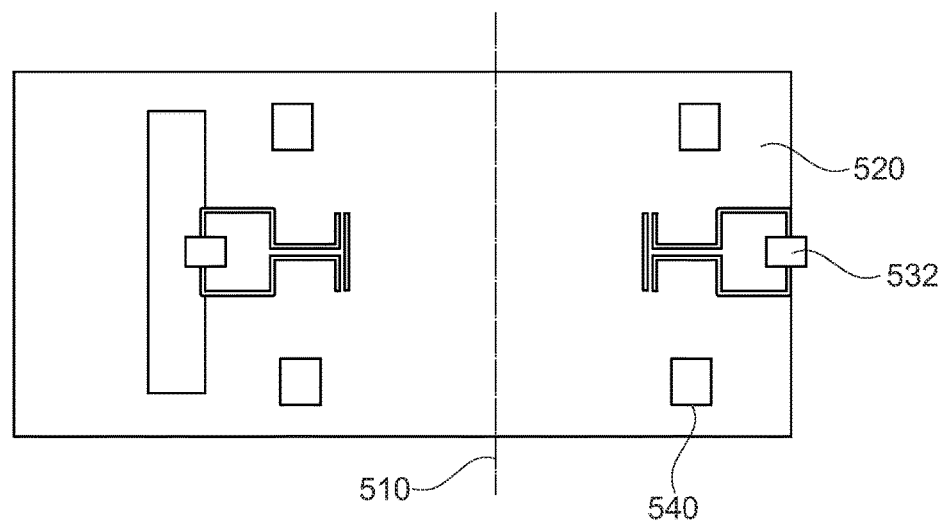
FIG. 5B illustrates a top view of an exemplary microelectromechanical device that includes motion limiters.

Basically the first stopper element could be provided by a region of the first structural layer 502 underneath the motion limiter structure or a region of the second structural layer over the motion limiter structure. However, advantageously, the first stopper element includes at least one protrusion 530 that is locally raised from its structural layer and thus extends farther towards the movable mass 520 than the surface of the structural layer. At minimum the first stopper element may include one protrusion on one structural surface, but in this example, the movable mass moves between two structural layers, and the first stopper element includes two protrusions, one protrusion 530 on the first structural layer 502 and another protrusion 532 on the second structural layer 504. FIG. 5B illustrates positions of protrusions 532, 542 on the second structural layer.

Figure 6:
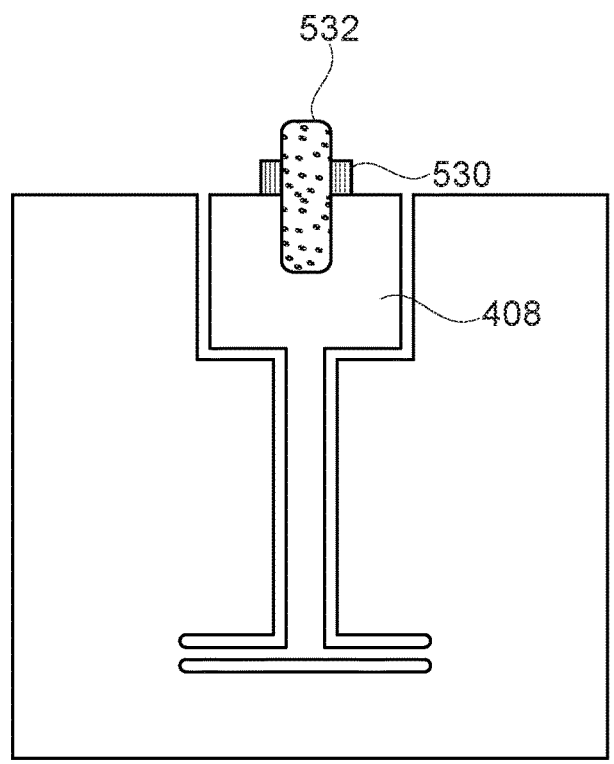
FIG. 6 illustrates an example of positioning of a motion limiter structure and first stopper elements.

Opposite positioning of the impact element of the motion limiter structure and the first stopper element may be interpreted that projection of the impact element and projection of the first stopper element on the first structural layer at least partly coincide. FIG. 6 illustrates an example of positioning of the motion limiter structure 400 of FIG. 4 and the first stopper elements 530, 532 on the structural layers of FIGS. 5A and 5B. FIG. 6 shows a projection of a motion limiter structure, a bottom part 530 of a first stopper element, and a top part 532 of a first stopper element in a top view. As may be seen, the parts 530, 532 of the first stopper element may coincide with each other, and they do coincide with the impact element 408 of the motion limiter structure 400. Advantageously, the elements are axially symmetric and the symmetry axes of the elements are aligned with the coupling beam of the motion limiter structure. Advantageously at least one part of the first stopper element extends beyond the projection of the movable mass on the first structural layer. This makes the arrangement less sensitive to small alignment errors.

Because of the resiliency provided by the torsion element, an element pair that includes a motion limiter structure and at last one stopper element may be considered as a flexible limiter. A microelectromechanical device may include one or more of such flexible limiters in different parts of its structure. The flexibility of the flexible limiter may be easily tuned with stiffness of the elongate element. For example, in the motion limiter structure of FIG. 4, the tuning may be done with the torsion spring of the torsion element and the level arm length provided by the coupling beam. The tuning may be adapted to provide a flexural strength to overcome possible adherence between the motion limiter structure and the first stopper element at contact.

Returning back to FIGS. 5A and 5B, the microelectromechanical device may include also one or more stiff limiters. The role of the stiff limiter is to provide a stronger motion limiting stage that becomes activated later than a motion limiting stage provided by the flexible limiters. In a simple configuration, the stiff limiter may require one second stopper element. The second stopper element may include at least one protrusion 540 that is locally raised from its structural layer and thus extends farther towards the movable mass than the surface of the structural layer. At minimum, the second stopper element may include one protrusion on one structural surface, but in this example, also the second stopper element includes two protrusions, one protrusion 540 on the first structural layer 502 and another protrusion 542 on the second structural layer 504. In order to achieve a correct order of contact, a gap between a motion limiter structure and a first stopper element 530 of a flexible limiter is adapted to close before a gap between a second stopper element 540 and the movable mass 520 closes.

Figure 7:
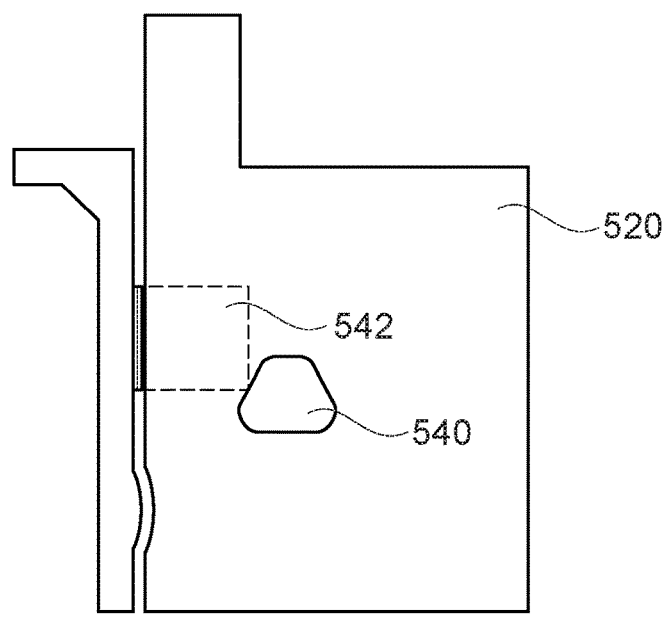
FIG. 7 illustrates an example of positioning of second stopper elements.

The second stopper element may extend within the projection of the movable mass, or at least part of the second stopper element may extend beyond the projection of the movable mass. FIG. 7 illustrates an example of positioning of the second stopper element on the structural layers of FIG. 5A. FIG. 7 shows projection of a potential impact section for the second stopper element in the movable mass 520, a bottom part 540 of a second stopper element, and a top part 542 of a second stopper element in a top view. As may be seen, the parts 540, 542 of the second stopper element coincide at least with a designed impact region of the movable mass. The stiffness of the exemplary stiff element may vary according to the type of the element. The stiff limiter may be a flexible element with high flexural strength, or it may be a rigid element, as shown in FIG. 7. The strength of motion limiting of the rigid element of FIG. 7 is dependent on the contact area of the second stopper element, more specifically, on the contact area of the part that makes the first contact with the movable mass.

A combination of one or more flexible limiters and one or more stiff limiters may be used to create a mufti-stage motion limiter with different strengths of motion limiting. For example, the multistage motion limiter may include first stage for which a flexible limiter is tuned to limit the motions of the movable mass in overload situations of normal operation or during testing, and a second stage for which a stiff (rigid) limiter is tuned to limit the motions of the movable mass during mechanical shocks. Further stage combinations may be applied within the scope. The flexural strengths of the motion limiter structure of the flexible limiter may be adjusted to be high enough to provide a restoring force that pulls the movable mass off the second stopper element after contact.

Figure 8:
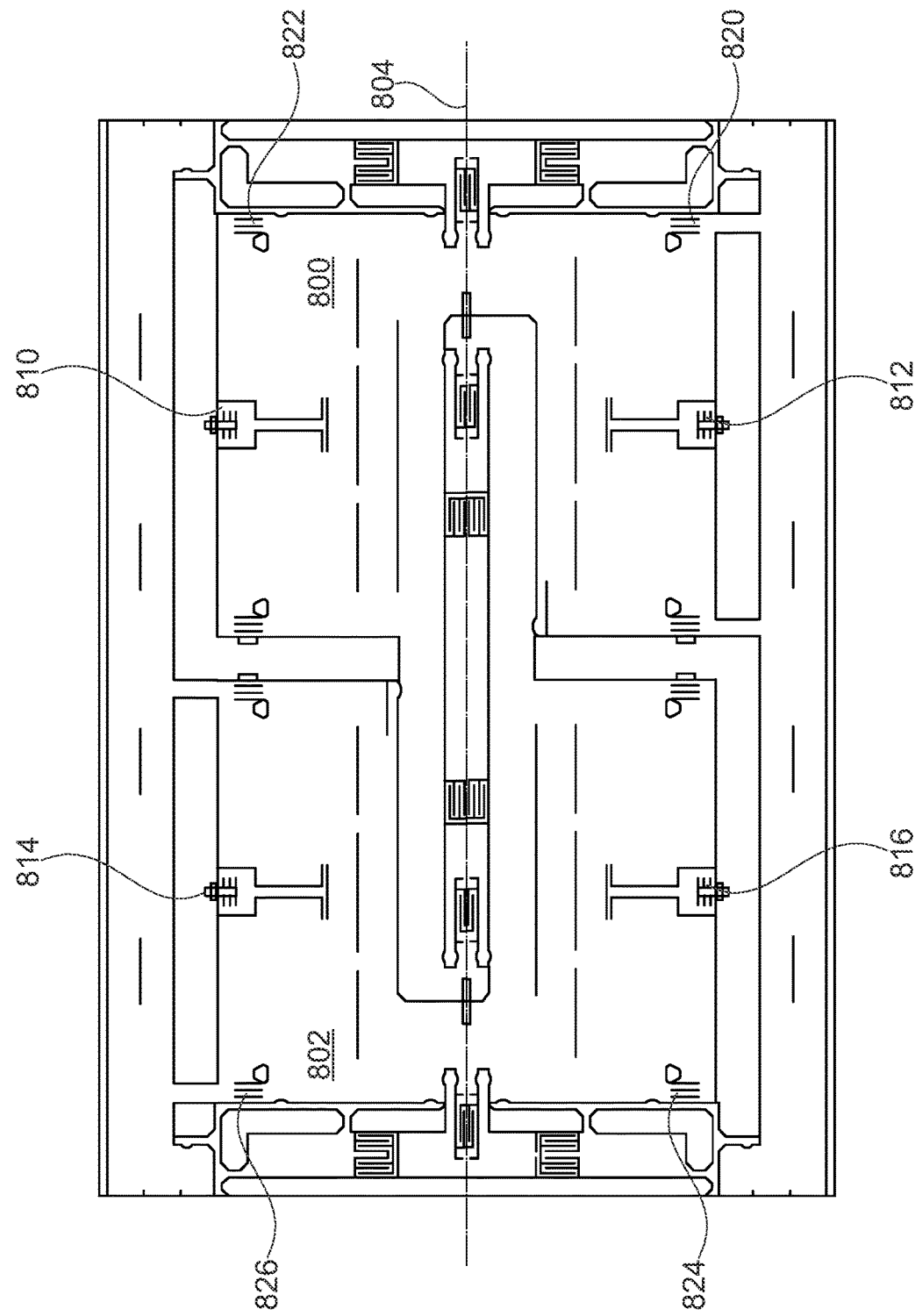
FIG. 8 illustrates an exemplary two-stage motion limiting configuration.

FIG. 8 illustrates an exemplary configuration for the two-stage motion limiter structures and stopper elements of FIGS. 5A and 5B. FIG. 8 shows a top view of a structural layer including two movable masses 800, 802. The movable masses may be suspended for anti-phase primary rotary motion about an axis 804. As shown in FIG. 8, both ends of the movable masses 800, 802 may include a flexible limiter 810, 812, 814, 816.

The configuration may include also one or more stiff limiters 820, 822, 824, 826. In the exemplary configuration of FIG. 8, in order to ensure correct order of contact, the distance from the stiff limiters to the rotary axis have been adjusted to be less than the distance from the flexible limiters to the rotation axis. It is, however, noted that the order of contact between the limiters is dependent on the type of the primary motion and the dimensions of the gaps between the contact points.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical device, comprising:
a first structural layer;
a movable mass suspended for a primary out-of-plane motion relative to the first structural layer;
a cantilever motion limiter structure etched into the movable mass; and
a first stopper element on the first structural layer, disposed opposite to the cantilever motion limiter structure in the direction of the out-of-plane motion,
wherein the cantilever motion limiter structure includes an elongate element,
wherein one end of the elongate element is coupled to the movable mass with a torsion element providing an in-plane torsion spring, and the other end is free, and
wherein the elongate element extends between two inner side walls of the movable mass.

2. The microelectromechanical device of claim 1, wherein a lateral end of the elongate element comprises an impact element.

3. The microelectromechanical device of claim 2, wherein one side surface of the impact element coincides with a side surface of the movable mass.

4. The microelectromechanical device of claim 1, wherein each end of the torsion spring is coupled to the movable mass.

5. The microelectromechanical device of claim 4, wherein the elongate element comprises:
an impact element, and
a coupling beam coupling the torsion element to the impact element.

6. The microelectromechanical device of claim 5, wherein the impact element is configured to, upon impact, undergo a resilient rotary motion about an in-plane rotary axis.

7. The microelectromechanical device of claim 5, wherein the torsion element comprises a torsion bar coupled to two coupling points in the movable mass.

8. The microelectromechanical device of claim 5, wherein a projection of the impact element and a projection of the first stopper element on the first structural layer at least partly coincide.

9. The microelectromechanical device of claim 5, wherein a largest width of the impact element is at least three times a width of the coupling beam.

10. The microelectromechanical device of claim 1, wherein the first stopper element comprises a protrusion locally raised from the first structural layer.

11. The microelectromechanical device of claim 10, wherein the first stopper element extends beyond a projection of the movable mass on the first structural layer.

12. The microelectromechanical device of claim 1, wherein the primary out-of-plane motion is rotary motion about a rotation axis.

13. The microelectromechanical device of claim 1, wherein an element pair including the cantilever motion limiter structure and the first stopper element form a flexible limiter.

14. The microelectromechanical device of claim 13, further comprising a stiff limiter configured to provide a motion limiter stage that becomes activated later than a motion limiter stage provided by the flexible limiter.

15. The microelectromechanical device of claim 14, wherein the stiff limiter comprises a second stopper element protruding from the first structural layer, positioned such that a gap between the cantilever motion limiter structure and a first stopper element of a flexible limiter closes before a gap between the second stopper element and the movable mass closes.

16. The microelectromechanical device of claim 15, wherein at least part of the second stopper element extends beyond the projection of the movable mass on the first structural layer.

17. The microelectromechanical device of claim 15, wherein the primary out-of-plane motion is rotary motion about a rotation axis, and a distance from the stiff limiter to the rotation axis is less than a distance from the flexible limiter to the rotation axis.

18. The microelectromechanical device of claim 1, further comprising a second structural layer configured such that the movable mass is configured to move in primary rotary motion between the first structural layer and the second structural layer.

19. The microelectromechanical device of claim 18, wherein the second structural layer includes at least one first stopper element.

20. The microelectromechanical device of claim 18, wherein the second structural layer includes at least one second stopper element.

21. The microelectromechanical device of claim 20, wherein the second structural layer includes a corresponding set of first and second stopper elements with respect to the first structural layer.

22. The microelectromechanical device of claim 12, wherein the first structural layer comprises a substrate and the second structural layer comprises a cap wafer of a MEMS die.

23. The microelectromechanical device of claim 22, wherein a gap between an impact element of a motion limiter structure and the first stopper element of the first structural layer is greater than a gap between an impact element of a motion limiter structure and the first stopper element of the second structural layer.

* * * * *